(12) United States Patent
Liou

(10) Patent No.: US 9,444,614 B2
(45) Date of Patent: Sep. 13, 2016

(54) DYNAMIC POWER CONTROL FOR CDR

(71) Applicant: Synaptics Display Devices GK, Tokyo (JP)

(72) Inventor: Yude Liou, Saratoga, CA (US)

(73) Assignee: Synaptics Display Devices GK, Tokyo (JP)

( * ) Notice: Subject to any disclaimer, the term of this patent is extended or adjusted under 35 U.S.C. 154(b) by 140 days.

(21) Appl. No.: 14/227,469

(22) Filed: Mar. 27, 2014

(65) Prior Publication Data

US 2015/0279299 A1    Oct. 1, 2015

(51) Int. Cl.
G09G 5/00 (2006.01)
H04L 7/033 (2006.01)
G09G 3/20 (2006.01)
H03L 7/00 (2006.01)
H04L 7/00 (2006.01)

(52) U.S. Cl.
CPC ........... *H04L 7/0331* (2013.01); *G09G 3/2096* (2013.01); *H03L 7/00* (2013.01); *G09G 5/008* (2013.01); *H04L 7/0025* (2013.01); *H04L 7/0337* (2013.01)

(58) Field of Classification Search
None
See application file for complete search history.

(56) References Cited

U.S. PATENT DOCUMENTS

| | | | |
|---|---|---|---|
| 8,589,708 B2 | 11/2013 | Flynn et al. | 713/322 |
| 2005/0156854 A1* | 7/2005 | Park | G09G 3/3696 345/100 |
| 2006/0045224 A1* | 3/2006 | Cranford | H04L 7/0337 375/355 |
| 2012/0049909 A1* | 3/2012 | Lin | H04L 7/0331 327/156 |
| 2012/0105115 A1* | 5/2012 | Yamamoto | H04L 7/0337 327/156 |
| 2012/0317430 A1* | 12/2012 | Rahman | G06F 1/3296 713/323 |

\* cited by examiner

*Primary Examiner* — Christopher R Lamb
(74) *Attorney, Agent, or Firm* — Osha Liang LLP

(57) ABSTRACT

An apparatus and method for dynamically controlling power of a device. In one embodiment, the apparatus includes a first circuit and a second circuit for generating a clock signal, wherein a frequency of the clock signal is dependent on a control voltage provided to the second circuit. A third circuit is coupled to receive the control voltage and is configured to adjust power consumed by the first circuit based on the control voltage.

14 Claims, 4 Drawing Sheets

DYNAMIC POWER CONTROL FOR CDR

BACKGROUND

High-speed serial data streams are often transmitted to a receiver without an accompanying clock signal. The receiver needs an appropriate clock to sample and recover data from the stream. In a process commonly known as clock and data recovery (CDR), the receiver can generate the needed clock from an approximate frequency reference, and then phase-align the clock to the center point between data transitions (i.e., a 0 to 1 or 1 to 0). The data stream can then be sampled using the phase-aligned clock. In this manner, the receiver can recover the true content of the input data stream notwithstanding a lack of an accompanying clock signal.

SUMMARY OF THE INVENTION

An apparatus and method is disclosed for dynamically controlling power of a device. In one embodiment, the apparatus includes a first circuit and a second circuit. The second circuit is configured for generating a clock signal, wherein a frequency of the clock signal is dependent on a control voltage provided to the second circuit. A third circuit is coupled to receive the control voltage and is configured to adjust power consumed by the first circuit using the control voltage.

BRIEF DESCRIPTION OF THE DRAWINGS

The present invention may be better understood in its numerous objects, features, and advantages made apparent to those skilled in the art by referencing the accompanying drawings.

The use of the same reference symbols in different drawings indicates similar or identical items.

DETAILED DESCRIPTION

The present invention relates to an apparatus and method for dynamic power control of a device such as a CDR or components thereof, it being understood the present invention should not be limited to use with a CDR or components thereof. The present invention will be described with reference to a mobile device employing a CDR, it being understood the present invention should not be limited thereto.

Figure 1:
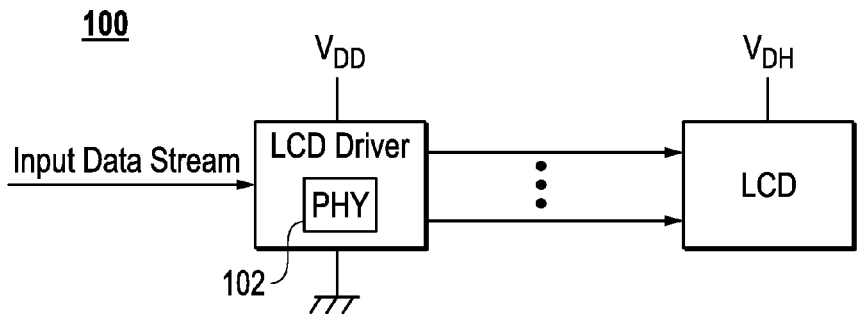
FIG. 1 is a block diagram illustrating an example mobile device.

FIG. 1 illustrates examples of some components contained within a mobile device 100 such as a smart phone. More particularly, FIG. 1 shows a liquid crystal display (LCD) driver coupled to an LCD. LCD driver includes a PHY device 102. In general a PHY device connects a link layer device to a physical medium such as an optical fiber or a cooper cable. The LCD receives data and other information from the LCD driver. The LCD displays data received from the LCD driver.

Figure 2:
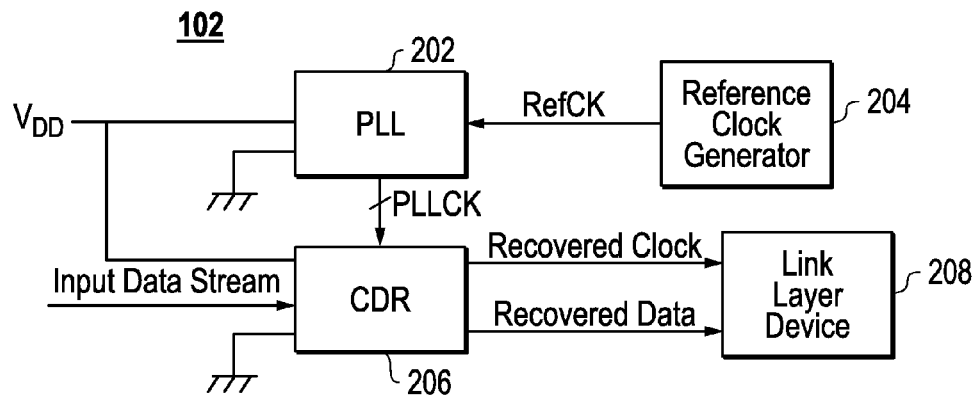
FIG. 2 is a block diagram illustrating an example PHY device employed in the LCD driver of the mobile device of FIG. 1.

With continuing reference to FIG. 1, FIG. 2 shows examples of some components of PHY 102. For the purposes of explanation only, all LCD drivers described herein are formed on a single substrate as a monolithic integrated circuit, it being understood the present invention should not be limited thereto.

The example PHY 102 includes a phase look loop (PLL) 202, a reference clock generator 204, a CDR 206 and a link layer device 208. The CDR 206 receives an input serial data stream without an accompanying clock signal. The PLL 202 generates a clock signal PLLCK with a frequency compatible with the data rate of the input data stream. The PLL clock is provided to and used by CDR 206 to sample data after CDR 206 phase aligns the PLL clock to the center point between transitions of the input data stream. Once sampled, the data and a clock are provided to link layer device 208 for subsequent processing. The LCD driver includes additional components (not shown) that process the data before the data is provided to the LCD for display. Both the PLL 202 and CDR 206 are powered by supply voltage $V_{DD}$ that is directly or indirectly provided by a battery (not shown) included in mobile device 100.

While there are several differing types, PLLs typically include a voltage controlled oscillator (VCO) (not shown in FIG. 2) that generates a clock. The VCO generates the clock with variable frequency. The PLL synchronizes the VCO clock frequency to the frequency of a reference clock signal RefCK through a feedback loop. The frequency of the VCO clock may drift as a result of changes in operating conditions such as the magnitude of $V_{DD}$ (which may decrease as energy in the mobile device's battery (not shown) dissipates), environmental temperature, etc. The frequency of the reference clock should remain relatively constant notwithstanding changes in operating conditions. Synchronizing the VCO clock with the reference clock ensures the frequency of the clock is maintained at a level that is compatible with the data rate of the input data stream. In other words, when the frequency of the VCO clock begins to drift as a result of changes in operating conditions, the PLL can be adjusted to bring the frequency back to the desired level.

The CDR 206 can convert the clock it receives from the PLL into a CDR clock, which is phase aligned to the center point between the transitions of the input data stream. When phase aligned by the CDR, the CDR clock can be used to properly sample the serial input data stream. The nonstop attribute of the CDR clock is useful when the incoming data stream does not have a transition change, i.e., a 0 to 1 or 1 to 0, for a while because of the data containing a series of sequential 1s or 0s.

Figure 3:
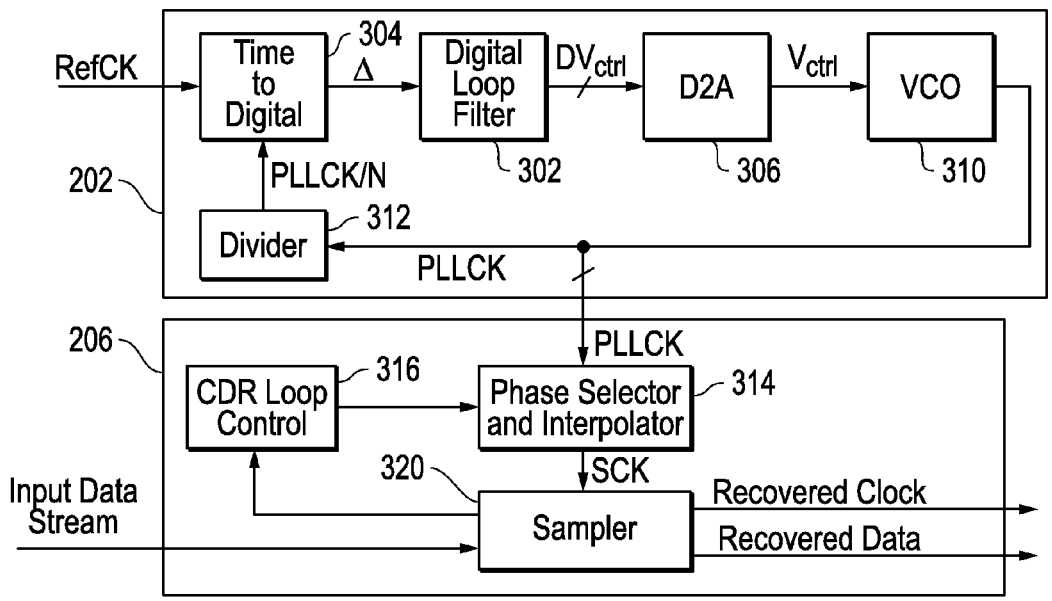
FIG. 3 is a block diagram illustrating an example PLL and an example CDR employed in the PHY device of FIG. 2.

FIG. 3 illustrates examples of some components of a digital PLL 202 and a CDR 206. Digital PLL 202 includes a VCO 310 that generates the PLL clock whose frequency is dependent on the magnitude of analog control voltage Vctrl. Time-to-digital circuit 304 receives RefCK and PLLCK/N, where PLLCK/N is the PLL clock with its frequency divided by integer N. In one embodiment, N is selected based on the expected data rate of the input data stream. N need not be static. In one embodiment, N could be adjusted during run time to accommodate a change in the data rate. However, for purposes of explanation, it will be presumed that N does not change after it is initially set.

Time-to-digital circuit 304 generates a digital signal that represents the phase error (i.e., time delay) if any between pulses of RefCK and PLLCK/N. A phase error indicates RefCK and PLLCK are not synchronized. Digital loop filter 302 generates an m-bit digital control signal DVctrl based on the smoothed output of time-to-digital circuit 304. Digital-to-analog converter (D2A) 306 converts the m-bit digital control signal DVctrl into analog control signal Vctrl. Because of the feedback via divider circuit 312, if a phase error develops between pulses of RefCK and PLLCK/N as a result of, for example, a change in the environmental temperature, the digital control voltage DVctrl, and thus the analog control voltage Vctrl provided to the VCO, will change accordingly until the pulses are once again realigned, thus resynchronizing the clocks.

The CDR 206 shown in FIG. 3 includes a phase selector and interpolator (PSI) 314 coupled to sampler 320 and CDR loop control 316. In one embodiment, sampler 320, as implied by its name, recovers data by sampling the input data stream with each clock edge of sample clock SCK. Using feedback provided by CDR loop control 316, PSI 314 converts PLLCK to sample clock SCK with edges that center between expected transitions of the input data stream. Sampler 320 provides the recovered data and a clock to the link layer device 208 (not shown in FIG. 3).

Components within a mobile device such as PSI 314 and sampler 320 consume power during operation. The mobile device battery's life, i.e., the amount of time the battery can provide adequate power before it needs to be recharged, depends upon the power consumption rate of components within the mobile device such as PSI 314 and sampler 320. Many variables affect the power consumption of components. Temperature is one variable. When the mobile device operates in a warm environment, more power is needed for components such as PSI 314 and sampler 320 to operate properly. The magnitude of $V_{DD}$ provided to the components is another variable. More power is needed for the components to operate properly when the magnitude of $V_{DD}$ drops. The speed at which components operate is yet another variable. If the data rate of the input data stream is high, PSI 314 and sampler 320 must operate at a high speed, which in turn requires more power. Variations in the manufacturing processes is still another variable that affects component power consumption. To illustrate, the same components in separate mobile devices operating under identical conditions (e.g., environmental temperature, $V_{DD}$ magnitude, input stream data rate, etc.) may consume power at different rates due to physical differences in underlying integrated circuit structure that were introduced by different manufacturing processes.

To ensure proper operation, components such as PSI 314 and sampler 320 are designed assuming the worst case scenario for the variables that affect power consumption. In other words, the components are designed assuming: they operate in a high environmental temperature with low $V_{DD}$; they receive an input data stream with a high data rate; they were manufactured with a process that will introduce inconsistencies in the underlying physical structure that are expected to adversely affect power consumption; etc. Because of this assumption, the components will consume more power than needed when they actually operate in low environmental temperature, with a VDD having a high magnitude, or when receiving a data stream with a low data rate. This excess power consumption will needlessly reduce the mobile device's battery life.

Figure 4:
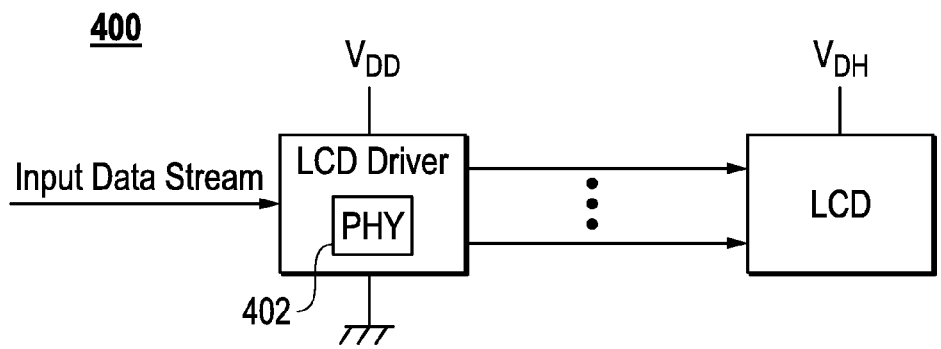
FIG. 4 is a block diagram illustrating an example mobile device employing one embodiment of the present invention.

FIG. 4 illustrates an alternative mobile device 400 employing an LCD driver in which power consumption of one or more components is dynamically controlled and optimized during run time in order to extend the mobile device's battery life. In one embodiment, the power consumption of the one or more components can be adjusted to accommodate unexpected changes in one or more variables (e.g., environmental temperature) as will be described.

Figure 5:
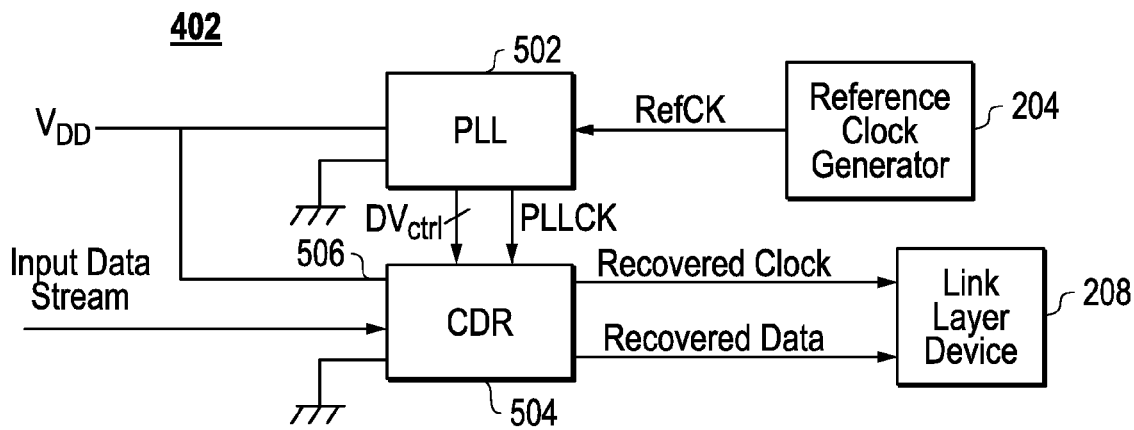
FIG. 5 is a block diagram illustrating an example PHY employed in the LCD driver of the mobile device of FIG. 4.

FIG. 5 illustrates examples of some components of a PHY device 402 contained within the LCD driver shown within FIG. 4. More particularly, PHY 402 includes a PLL 502 coupled to reference clock generator 204 and CDR 504. There are many similarities between the PLL 502 and CDR 504 shown in FIG. 5 and the PLL 202 and CDR 206 shown in FIG. 2. For example, both PLLs 202 and 502 synchronize reference clock RefCK and the PLL clock PLLCK as described above. Both PLL clocks have a frequency that is set to be compatible with the data rate of the input data stream. The DVctrl of both PLLs are adjusted through feedback to accommodate changes in operating conditions such as environmental temperature. Both CDRs 206 and 504 phase align their CDR clocks to the center point between transitions of their input data streams. And both CDRs use their phase aligned clocks to sample and recover data.

While similarities exist between PLL 502 and CDR 504 shown in FIG. 5 and PLL 202 and CDR 206 shown in FIG. 2, several important differences exist. For example, in addition to providing the PLL clock to CDR 504, PLL 502 provides the m-bit control signal DVctrl to CDR 504. As will be more fully described below, power consumed by one or more components of CDR 504 can be adjusted at run time in accordance with a change in DVctrl. To illustrate, at run time the value of DVctrl may change depending upon, for example, a change in the temperature of the environment in which mobile device 400 is operating; if the temperature lowers, the value of DVctrl should lower, and vice-versa. When the value of DVctrl changes, power provided to and consumed by one or more components will change; if DVctrl lowers, the power consumed by one or more devices should decrease, and vice-versa.

Figure 6:
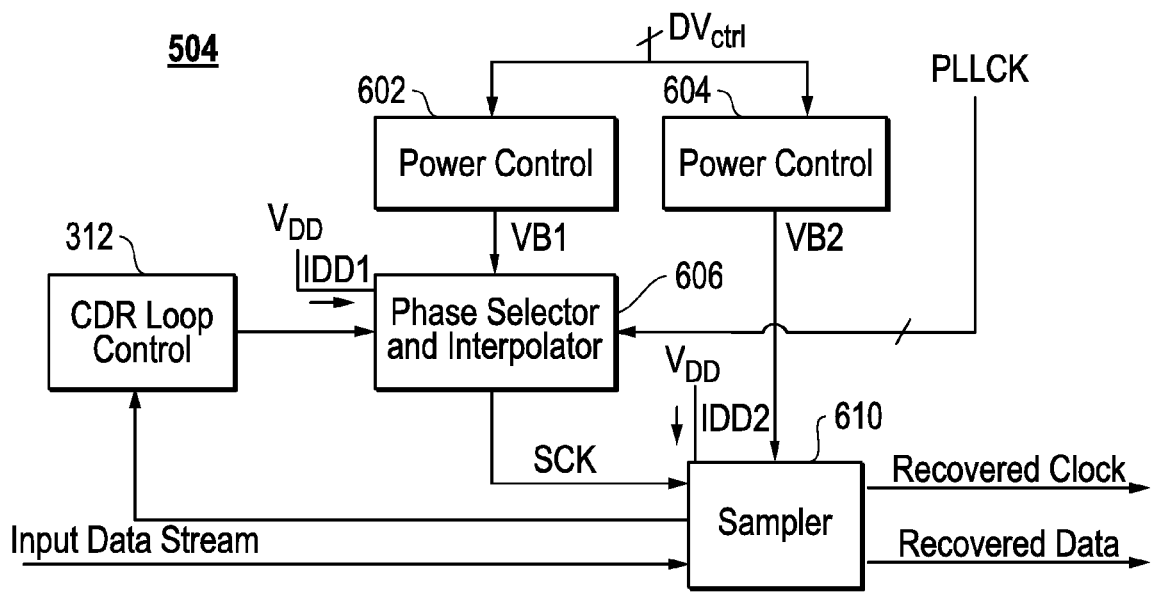
FIG. 6 is a block diagram illustrating an example CDR employed in the PHY of FIG. 5.

With continuing reference to FIG. 5, FIG. 6 illustrates examples of some components of one embodiment of CDR 504 shown within FIG. 5. Other embodiments are contemplated. CDR 504 includes a pair of power control circuits 602 and 604 coupled to receive the m-bit digital control signal DVctrl from PLL 502 (not shown in FIG. 6). Power control circuits 602 and 604 generate bias control voltages VB1 and VB2, respectively, which in turn are provided to PSI 606 and sampler 610, respectively. PSI 606 and sampler 610 are similar to PSI 314 and sampler 320 shown in FIG. 3 in terms of basic operation. Differences, however, exist. Unlike PSI 314 and sampler 320, PSI 606 and sampler 610 of FIG. 6 have respective throttle circuits (not shown) that receive bias voltages VB1 and VB2, respectively. These throttling circuits can control or adjust the power provided to and consumed by PSI 606 and sampler 610. Specifically, the throttling circuit for PSI 606 can increase or decrease the amount of power consumed by PSI 606 based upon an increase or decrease in the magnitude of bias voltage VB1; as throttling voltage VB1 increases, power provided to and consumed by PSI 606 increases proportionally, and vice versa. Similarly, the throttling circuit contained within sampler 610 adjusts the power consumed by sampler 610 based upon the bias control voltage VB2; the throttling of circuit sampler 610 will increase the power provided to and consumed by sampler 610 in response to an increase in VB2, and vice versa. In one embodiment the throttling circuits can adjust power provided to and consumed by PSI 606 and sample 610 during run time by adjusting the magnitude of supply currents $I_{DD1}$ and $I_{DD2}$, respectively. Thus, the throttling circuit in PSI 606 can increase or decrease $I_{DD1}$ when VB1 increases or decreases, and the throttling circuit in sampler 610 can increase or decrease $I_{DD2}$ when VB2 increases or decreases. In this manner, the power control circuits 602 and 604 operating in conjunction in with their respective throttling circuits can optimize the power provided to and consumed by PSI 606 and sampler 610 during run time.

Figure 7:
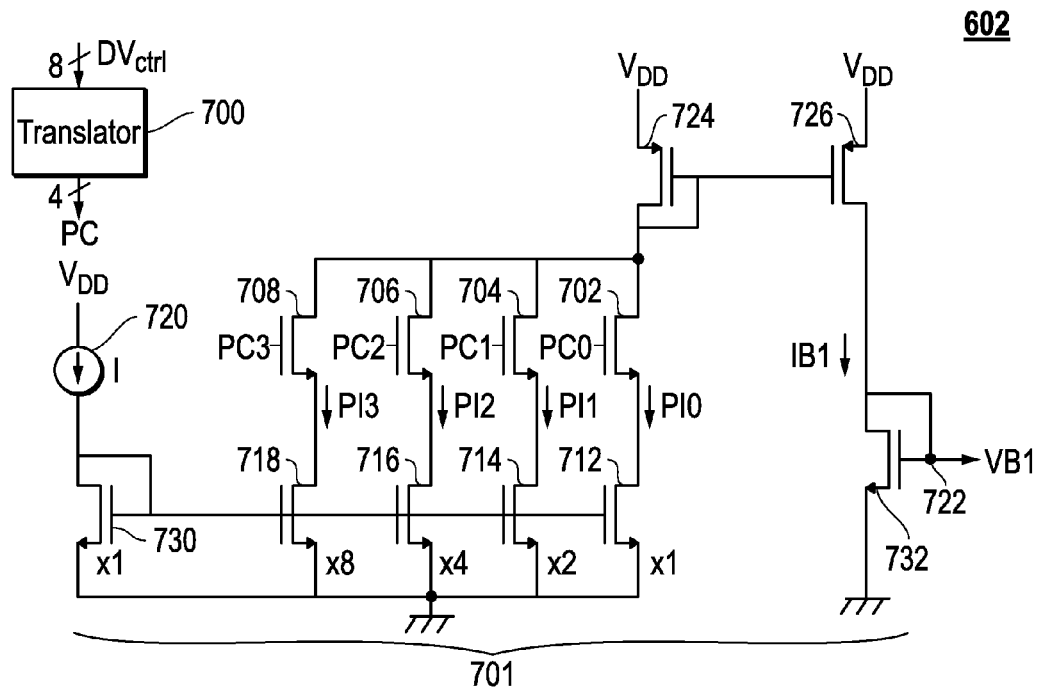
FIGS. 7 and 8 are block diagrams illustrating example power control circuits employed in the CDR of FIG. 6.
Figure 8:
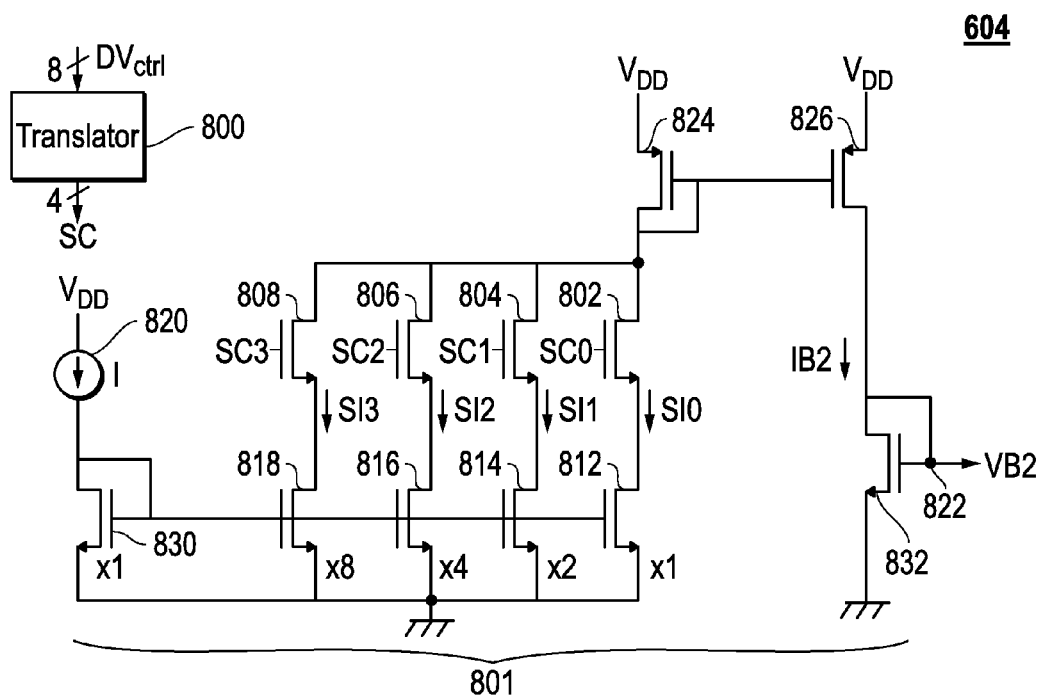

With continuing reference to FIG. 6, FIGS. 7 and 8 illustrate examples of some components found in power control circuit 602 and 604, respectively, according to one embodiment. Other embodiments of the power control circuits are contemplated. FIG. 7 shows a translator 700 configured to receive the m-bit control signal DVctrl from the PLL 502 (not shown). For purposes of explanation only, it will be presumed control signal DVctrl consists of 8 bits, it being understood that fewer or more bits are contemplated in alternative embodiments. Translator 700 may include a look-up table that maps the 8-bit control signal DVctrl to a 4-bit PSI power control signal PC. Again, for purposes of explanation only, it will be presumed PSI power control signal PC consists of 4 bits, it being understood that fewer or more bits are contemplated in alternative embodiments. A converter 701 can convert the 4-bit PSI power control signal into an analog equivalent voltage referred to herein as bias control voltage VB1. In converter 701 PC bits PC0-PC3 control switches 702-708, respectively. Switches 702-708 are coupled in series to MOSFET transistors 712-718, respectively, as shown. Transistors 712-718 are controlled by the same gate voltage. Transistors 712-718 are designed differently from each other. In one embodiment, the drain current of transistors 712, when activated, is 50% less than the drain current of transistor 714, when activated. The drain current of transistor 714, when activated, is 50% less than the drain current of transistor 716, when activated. The drain current of transistor 716, when activated, is 50% less than the drain current of transistor 718, when activated. When all of the switches 702-708 are closed, currents PI0-PI3 flow through switches 702-708, respectively. Due to the ratios of drain current of transistors 712-718, the magnitude of PI3 will be approximately twice the magnitude of PI2, which in turn is approximately twice the magnitude of PI1, which in turn is approximately twice the magnitude of PI0. Power control circuit 602 acts like a current mirror such that current IB1 flowing through transistor 732 is proportional to the summation of currents flowing through those switches 702-708 that are closed. Bias control voltage VB1 is generated at the gate of transistor 732. The magnitude of bias voltage VB1 is proportional to the magnitude of IB1. Thus, the magnitude of biased voltage VB1 is indirectly related to the value of DVctrl. In other words, as the value of control DVctrl increases or decreases, the magnitude of VB1 increases or decreases.

FIG. 8 illustrates the power control circuit 604 shown within FIG. 6. This circuit is substantially similar to the power control circuit 602 shown within FIG. 7. However, certain differences may exist. For example, translator 800 may include a look-up table that maps the 8-bit control signal DVctrl to a 4-bit sampler power control signal SC, which may be different than the 4-bit PSI power control signal PC in order to accommodate differences in the power characteristics of PSI 606 and sampler 610. Thus, translator 700 shown within FIG. 7 and translator 800 shown in FIG. 8 may generate two distinct 4-bit values for the same 8-bit input DVctrl. A converter 801 can convert the 4-bit sampler power control signal SC into an analog equivalent voltage referred to herein as bias control voltage VB2. In converter 801 the four bits SC0-SC3 of control signal SC control switches 802-808, respectively, as shown. Power control circuit 604 generates bias control voltage VB2 in the same or similar fashion as power control circuit 602 generates bias control voltage VB1. In particular, the magnitude of VB2 at the gate of transistor 832 increases or decreases with an increase or decrease in the value of DVctrl provided by PLL 502. It is noted in one embodiment, transistors 712-718 may be sized identically to transistors 812-818, respectively, so that they have the same drain current when activated. In this embodiment, the conversion characteristics of converter 701 is nearly identical to the conversion characteristics of converter 801. In an alternative embodiment, the transistors 812-818 may be sized differently when compared to the transistors 712-718, respectively, to provide further optimization of power provided to and consumed by the PSI 606 and sampler 610.

Figure 9:
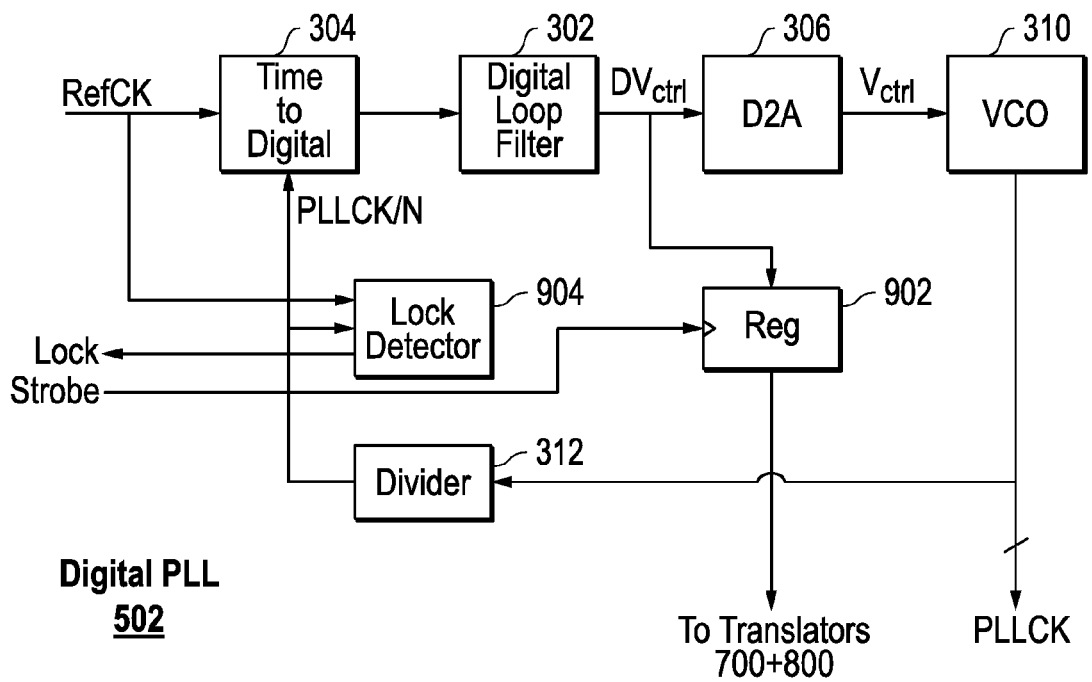
FIGS. 9 and 10 are block diagrams illustrating example PLLs employed in PHY of FIG. 5.
Figure 10:
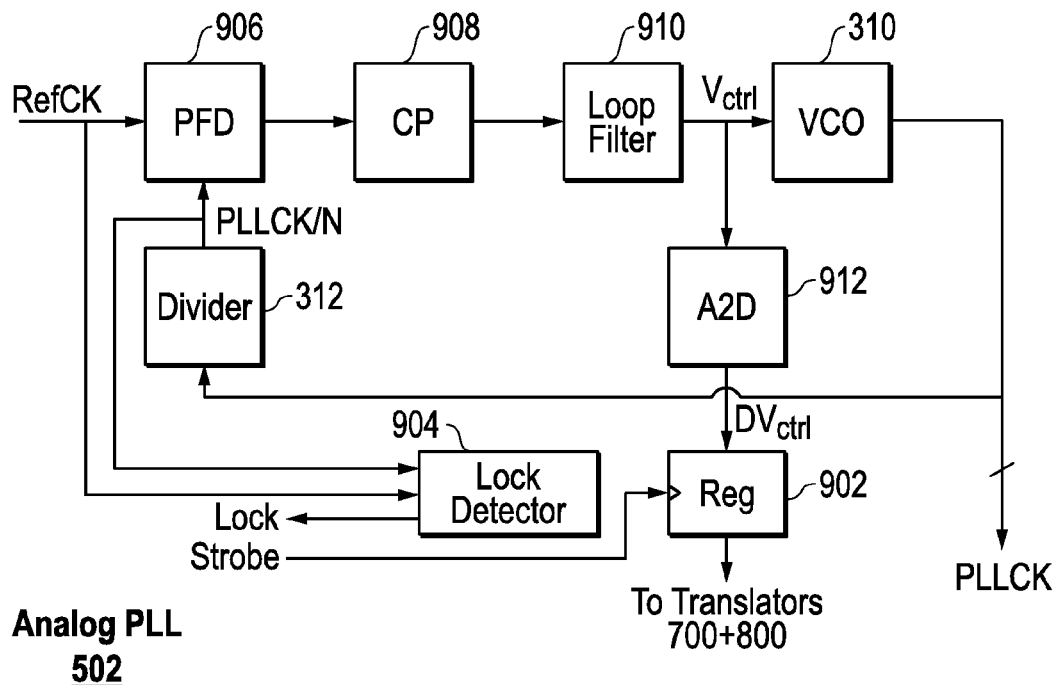

FIGS. 9 and 10 illustrate example, alternative embodiments of the PLL circuit 502 shown in FIG. 5. More particularly, FIG. 9 illustrates examples of some components of a digital version of a PLL 502 shown in FIG. 5, while FIG. 10 illustrates examples of some components of an analog version of PLL 502. Additional embodiments of PLL 502 are contemplated.

The digital PLL 502 shown in FIG. 9 includes many of the same components of the digital PLL 202 shown in FIG. 3. For example, PLL 502 of FIG. 9 includes the same VCO 310 that generates the VCO (i.e., the PLL clock) whose frequency is dependent on the magnitude of analog control voltage Vctrl. Time-to-digital circuit 304 receives reference clock RefCK and PLLCK/N. Time-to-digital circuit 304 generates a signal that represents the phase error, if any, between pulses of RefCk and PLLCK/N. Digital loop filter 302 generates digital control signal DVctrl based on a smoothed output of time-to-digital circuit 304. Digital-to-analog converter (D2A) 306 converts digital control signal DVctrl into analog control signal Vctrl. During operation, if a phase error develops between pulses of RefCK and PLLCK/N as a result of, for example, a change in the environmental temperature and/or a change of $V_{DD}$ powering the VCO, the digital control voltage DVctrl, and thus the analog control voltage Vctrl provided to the VCO, will change accordingly until the pulses are once again realigned.

While similarities exist between the PLLs shown in FIGS. 3 and 9, substantially differences exist. For example, the PLL in FIG. 9 includes a register 902 coupled to receive and store DVctrl in response to activation by a strobe signal. The DVctrl held in register 902 is the DVctrl provided to translators 700 and 800 of FIGS. 7 and 8. Lock detector 904 monitors the phase error between RefCK and PLLCK/N in one embodiment. A lock signal is activated when phase error is less than a preset threshold. The LCD driver shown in FIG. 4 continuously monitors the lock signal. After the lock signal is activated (i.e., which occurs when the phase error is less than the present threshold), the LCD driver issues the strobe signal at proper system timing to activate register 902, which stores the current value of DVctrl. Different lock detectors are contemplated.

The analog PLL 502 of FIG. 10 contains a phase frequency detector (PFD) 906 that compares the phase difference between PLLCk/N and RefCK and generates a digital pulse whose width is proportional to the phase error. The PFD output is fed to a charge pump 908 which converts the digital error pulse into an analog error current. The loop filter 910 collectively integrates the error current to generate the analog control voltage Vctrl, which in turn controls the frequency of the PLL clock generated by VCO 310. Analog-to-digital (A2D) 912 converts analog control voltage Vctrl to digital control DVctrl. Like the digital PLL shown in FIG. 9, the analog PLL 502 also contains a register 902 that is coupled to receive and store DVctrl from A2D 912 in response to activation by the Strobe signal. During operation, if a phase error develops between RefCK and PLLCK/N as a result of, for example, a change in the environmental temperature, the analog control voltage Vctrl provided to the VCO, and thus the digital control voltage DVctrl, will change accordingly until the phase error is eliminated.

One of ordinary in the art understands that if one or more operating conditions change during run time such as environmental temperature, the magnitude of supply voltage, etc., then DVctrl will change accordingly, which in turn adjusts the power provided to and consumed by PSI 606 and sampler 601. In this manner, the power consumed by CDR 504 can be optimized during run time. It is further noted that the value stored within register 902 depends upon the frequency of the PLL clock, which in turn is selected to be compatible with the data rate of the input stream. Thus assuming constant temperature, constant supply voltage VDD, etc., the value of the control signal DVctrl stored within register 902 for a PLL clock with a frequency of one gigahertz, should be lower than the value of the control signal DVctrl stored within register 902 for a PLL clock frequency of three gigahertz. As a result, the power consumed by CDR 504 when recovering data of a stream with a one gigahertz data rate will be lower than the power consumed by CDR 504 when recovering data of a stream with a three gigahertz data rate.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A mobile device comprising:
   a liquid crystal display (LCD); and
   an LCD driver coupled to the LCD and configured to receive a data stream, wherein the LCD driver comprises:
      a voltage controlled oscillator (VCO) coupled to receive a VCO control voltage, wherein the VCO is configured to generate a clock signal with a frequency that depends on a magnitude of the VCO control voltage, and
      a circuit coupled to receive the VCO control voltage, wherein power consumed by the circuit depends on the magnitude of the VCO control voltage, wherein the circuit comprises:
         a first translation circuit configured to translate the VCO control voltage into a first translated control voltage,
         a first circuit, wherein power consumed by the first circuit depends on the first translated control voltage,
            wherein the first circuit is contained in a clock data recovery circuit.

2. The mobile device of claim 1, wherein first circuit comprises a first throttling circuit that is configured to control power consumed by the first circuit based on the first translated control voltage.

3. The mobile device of claim 1, wherein the circuit further comprises:
   a second translation circuit configured to translate the VCO control voltage into a second translated control voltage, wherein the first and second translated control voltages are unequal; and
   a second circuit, wherein power consumed by the second circuit depends on the second translated control voltage.

4. The mobile device of claim 3,
   wherein the first circuit comprises a first throttling circuit that is configured to control power consumed by the first circuit based on the first translated control voltage, and
   wherein the second circuit comprises a second throttling circuit that is configured to control power consumed by the second circuit based on the second translated control voltage.

5. The mobile device of claim 1, wherein the first circuit is coupled to receive the data stream and the clock signal or a modification thereof.

6. The mobile device of claim 1,
   wherein the circuit comprises an analog to digital converter for converting the VCO control voltage into a digital VCO control signal,
   wherein the first translation circuit comprises a first lookup table that maps the digital VCO control signal to a first digital control signal, and
   wherein the first translation circuit comprises a first convertor that converts the first digital control signal into the first translated control voltage.

7. The mobile device of claim 3,
   wherein the circuit comprises an analog to digital converter for converting the VCO control voltage into a digital VCO control signal,
   wherein the first translation circuit comprises a first lookup table that maps the digital VCO control signal to a first digital control signal,
   wherein the first translation circuit comprises a first converter that converts the first digital control signal into the first translated control voltage,
   wherein the second translation circuit comprises a second lookup table that maps the digital VCO control signal to a second digital control signal,
   wherein the second translation circuit comprises a second converter that converts the second digital control signal into the second translated control voltage, and
   wherein the first digital control signal does not equal the second digital control signal.

8. The mobile device of claim 1, wherein the VCO control voltage varies with a change in an operating condition of the mobile device.

9. A method implemented in a mobile device, the method comprising:
   generating a clock signal, wherein a frequency of the clock signal is dependent on a control voltage;
   translating the control voltage into a first translated control voltage;
   adjusting power consumed by a first circuit based on the first translated control voltage;
   translating the control voltage into a second translated control voltage, wherein the first and second translated control voltages are unequal; and
   adjusting power consumed by a second circuit based on the second translated control voltage.

10. The method of claim 9, wherein adjusting power consumed by the first circuit comprises adjusting current provided to the first circuit.

11. The method of claim 9,
wherein the first circuit comprises a first throttling circuit that is configured to control power consumed by the first circuit based on the first translated control voltage.

12. The method of claim 9, further comprising the first circuit receiving a serial data stream and the clock signal or a modification thereof.

13. The method of claim 9,
wherein translating the control voltage into the first translated control voltage comprises:
converting the control voltage into a digital control signal,
mapping the digital control signal to a first digital control signal, and
converting the first digital control signal into the first translated control voltage, and
wherein translating the control voltage into the second translated control voltage comprises:
mapping the digital control signal to a second digital control signal, wherein the first and second digital control signals are not equal to each other, and
converting the second digital control signal into the second translated control voltage.

14. A mobile device comprising:
an LCD coupled to an LCD driver, wherein the LCD driver comprising:
a first circuit;
a second circuit for generating a clock signal, wherein a frequency of the clock signal is dependent on a control voltage provided to the second circuit;
a third circuit for translating the control voltage into a first translated control voltage;
a fourth circuit for adjusting power consumed by the first circuit based on the first translated control voltage;
a fifth circuit;
a sixth circuit for translating the control voltage into a second translated control voltage; and
a seventh circuit for adjusting power consumed by the fifth circuit based on the second translated control voltage.

* * * * *